United States Patent [19]

Kaufman et al.

[11] Patent Number: 5,307,015
[45] Date of Patent: Apr. 26, 1994

[54] NMR RELAXOMETRY USING VARIABLE INITIAL FLIP ANGLE

[75] Inventors: Leon Kaufman, San Francisco; Joseph W. Carlson, Kensington, both of Calif.

[73] Assignee: The Regents of the University of California, Oakland, Calif.

[21] Appl. No.: 909,747

[22] Filed: Jul. 7, 1992

Related U.S. Application Data

[63] Continuation-in-part of Ser. No. 705,964, May 28, 1991, Pat. No. 5,281,913, which is a continuation-in-part of Ser. No. 545,068, Jun. 29, 1990.

[51] Int. Cl.$^5$ .............................................. G01R 33/20
[52] U.S. Cl. ..................................... 324/309; 324/307
[58] Field of Search ............... 324/307, 309, 309, 313, 324/300; 128/653.2

[56] References Cited

U.S. PATENT DOCUMENTS

| | | | |
|---|---|---|---|
| 3,774,103 | 11/1973 | Laukien | 324/313 |
| 4,573,015 | 2/1986 | Abe et al. | 324/313 |
| 4,602,641 | 7/1986 | Feinberg | 128/653 |
| 4,654,595 | 3/1987 | Sepponen | 324/309 |
| 4,713,616 | 12/1987 | Shimazaki et al. | 324/309 |
| 4,716,369 | 12/1987 | Sekihara et al. | 324/309 |
| 4,887,034 | 12/1989 | Smith | 324/307 |
| 4,962,357 | 10/1990 | Sotak | 324/309 |
| 5,034,692 | 7/1991 | Laub et al. | 324/309 |
| 5,057,776 | 10/1991 | Macovski | 324/309 |

FOREIGN PATENT DOCUMENTS

| | | | |
|---|---|---|---|
| 2128745 | 5/1984 | United Kingdom . | |
| 2210982A | 6/1989 | United Kingdom | G01N 24/08 |
| WO90/03583 | 4/1990 | World Int. Prop. O. | G01R 33/38 |

OTHER PUBLICATIONS

Yee et al, "Localized Volume Selection Technique Using An Additional Radial Gradient Coil", pp. 56-63, *Magnetic Resonance in Medicine*, No. 12, 12(1989) Oct., Duluth, Minn., U.S.
Cho et al, "Time-of-Flight MR Angiography Using Selective Saturation Method" 1988, Society of Magnetic Resonance in Medicine, 7th Annual Meeting and Exhibition, San Francisco, Calif., U.S. (no month).
Yamada et al, "NMR Fresnel Transform Imaging Using a Scannable Nonlinear Field Gradient", Electronics and Communication in Japan, Part 2, vol. 71, No. 3, 1988, Silver Spring, Md., U.S. (no month).
Lundbom et al, "Magnetic Field Dependence of $1/T_1$ of Human Brain Tumors" *Investigative Radiology*, Nov. 1990, vol. 25, pp. 1197-1205.
Koenig et al, "NMR Spectroscopy of Cells & Organism," vol. II, Gupta, Editor, pp. 75-114, 1987. (no month).
Ortendahl et al., "Analytical Tools for Magnetic Resonance Imaging", *Radiology*, vol. 153, No. 2, Nov. 1984, pp. 479-488.
Crooks et al., "Magnetic Resonance Imaging: Effects of Magnetic Field Strength," *Radiology*, vol. 151, No. 1, Apr. 1984.

*Primary Examiner*—Michael J. Tokar
*Assistant Examiner*—Raymond Y. Mah
*Attorney, Agent, or Firm*—Nixon & Vanderhye

[57] ABSTRACT

MRI T1 relaxometry is performed using a single fixed strength magnetic background field for RF signal transmission and reception thus greatly simplifying RF circuitry design and/or adjustment Switched differing strength background magnetic fields are employed at other times in the relaxometry cycle so as to predominate the NMR T1 relaxation parameter value and thus permit relaxometry determinations of T1 values versus magnetic field strength (or the equivalent corresponding NMR RF frequency) at N data points using as few as N+1 measurement cycles. In one embodiment, the booster field is switched on for fixed time intervals $\tau$ while variable initial NMR nutation pulses $\alpha$ are utilized as the controlled relaxometry variable parameter. Process and apparatus are disclosed for thus efficiently achieving in vivo NMR relaxometry (including magnetic resonance imaging if desired).

21 Claims, 6 Drawing Sheets

NMR RELAXOMETRY USING VARIABLE INITIAL FLIP ANGLE

This application is a continuation-in-part of commonly assigned copending U.S. patent application Ser. No. 07/705,964 filed May 28, 1991, now Pat. No. 5,281,913 issue date: Jan. 25, 1994 entitled "NMR Relaxometry Using Fixed RF Frequency Band" naming Messrs. Kaufman and Carlson as joint inventors which is, in turn, a continuation-in-part of commonly assigned co-pending U.S. patent application Ser. No. 07/545,068 filed Jun. 29, 1990, (still pending) entitled "Switched-Field MRI" and naming Messrs. Carlson A., Crooks and Kaufman as joint inventors. The entireties of these related co-pending applications are hereby incorporated by reference.

This invention relates to method and apparatus for performing nuclear magnetic resonance (NMR) relaxometry. In vivo magnetic resonance imaging (MRI) may be simultaneously employed so as to provide NMR relaxometry measurements for the voxels of two or three dimensional images of living tissue. In effect, NMR relaxometry is used in imaging sequences having an acceptable total imaging time.

The referenced related first-filed co-pending application describes MRI apparatus and method wherein the background magnetic strength $B_o$ may be selectively switched to different magnitudes at different times in NMR pulse sequences for different effects. However, it does not explicitly discuss NMR relaxometry. The second-filed related co-pending application does address NMR relaxometry but does not explicitly discuss an embodiment using variable initial flip angles as the controlled relaxometry variable.

NMR relaxometry is per se known. For example, Lundbom et al in "Magnetic Field Dependence of 1/T₁ of Human Brain Tumors," *Investigative Radiology*, November 1990, Vol. 25, p 1197-1205 describe NMR relaxometry providing plots of proton relaxation rates T1 versus proton Larmor frequency/magnetic field strength. As Lundbom et al have shown, different types of tissue may be distinguished (i.e., identified) as a function of such relaxometry measurements.

Koenig also describe "A Field-Cycling Relaxometer" in a chapter on Relaxometry of Tissue within the text of "NMR Spectroscopy of Cells & Organisms," Volume II, Raj K. Gupta, Editor, CRC Press, Boca Raton, Fla. (1987), pp 75-114. Koenig et al first equilibrate nuclei at either zero Gauss or very high Gauss (e.g., 1.2 T). Then the field is switched to a T1 measurement value and, after a "measurement time to allow exponential field change at this new field, the field is changed to a fixed NMR value at which a 90°-180° spin echo measurement is quickly made. Since this SE magnitude is proportional to the magnetization achieved during the selected measurement time, one can effectively plot the exponential change in nuclei magnetization (and thus discern T1) by repeating the experiment for different measurement times. Koenig et al describe 23 cycles for each T1 measurement at a given field strength. However, as noted, all RF signals are conveniently made at a fixed magnetic field value.

Traditional NMR relaxometry (e.g., such as that in Koenig) is performed on an entire sample (e.g., as contained in a test tube within laboratory NMR apparatus). Such is not conducive to in vivo measurements—such as in the context of magnetic resonance imaging (MRI).

Ramping or changing the background magnetic field strength (e.g., as might be suggested by Lundbom et al) is not possible in conventional permanent magnet MR systems and is, at best, time consuming in a resistive or superconductive solenoidal magnet MRI system (especially if the time to reach stable magnet operation is added to the ramping of the magnetic field strength itself).

Such a straight forward approach to in vivo NMR/MRI relaxometry also would require the RF transmitter/receiver frequency (and all attendant RF circuits, coils, amplifiers, etc.) to be changed and/or retuned to the new NMR Larmor frequency associated with the new background field strength.

Koenig et al is at least a more interesting approach since all RF measurements are made at a fixed magnetic field strength—and hence at fixed RF frequency bands. However, the Koenig et al approach will cause nuclei magnetization to partly equilibrate during the NMR measurement phase. If only a small field change is involved, the change in equilibrium magnetization may also be very small. To enhance the change in magnetization, Koenig et al allows the nuclei magnetization to first come to equilibrium with either a very strong (e.g., 1.2 T) or very weak (e.g., zero) magnetic field. Furthermore, this prior "soak" field is re-applied before each of many (e.g., 23) data point measurement cycles (e.g., using many different measurement time intervals at each given measurement field value). Such a technique may be excellent for laboratory samples without imaging. However, it would take far too long for use in effective MR imaging procedures with in vivo patient anatomy.

Koenig et al use a technique of (1) applying a soak field, (2) applying a "relaxation rate field" for some amount of time and (3) doing NMR at a third field. The three steps are repeated using variable time delays in step (2).

Now, however, we have discovered a technique for using the field-switched MRI apparatus of our earlier above-referenced co-pending application so as to perform NMR relaxometry measurements at different effective background magnetic field strengths $B_o$—even in a two or three dimensional MRI context—in vivo, and still without the need to change RF operating frequencies from those employed in regular MRI procedures using a steady background magnetic field $B_o$. In effect, we dispense with step (1) of Koenig et al and apply step (2) with only one time delay. There are at least three exemplary ways to achieve this desired result.

1. One way is to first measure T1 at the base field of the magnet using any one of the common conventional techniques. Subsequent measurements at a switched field require solution of the Bloch equations for the evolution in a multi-step, switched field. Finding T1 at the switched field involves solving an equation, an example is given below. This task can be programmed quite easily and solved numerically.

2. A second technique is to apply a 90 degree NMR RF pulse prior to the switched field. This is a distinct way of doing the measurement but may not turn out to be the most accepted technique. This is physically analogous to applying a zero "soak" field.

3. A third technique is to flip the spin system through some initial nutation angle α, then turn on the switched boost field for some time τ after which the magnetization can be measured with a conventional 2 D or 3 D imaging sequence. By changing the initial flip angle a, relaxation data can be generated.

In our exemplary embodiments, the main magnet of a MRI system need not be changed or ramped. Rather, a switched additive/subtractive field can be raised or lowered relative to the main field and utilized only at times when RF signals are not being transmitted or received. In this way, the RF receiver/transmitter frequencies may be fixed to the usually expected frequencies and bandwidths and RF coils and other RF circuitry need not be unusually changed or manipulated.

Furthermore, in the second exemplary embodiment, instead of a long pre- "soak" period at an extremely high or extremely low magnetic field, we use a simple 90° NMR RF nutation pulse. This is roughly equivalent in results to applying a zero field for a very long time—but much easier and faster to implement.

We have also devised a technique for measuring T1 with just one application of the desired measurement field strength. While this may lower the effective signal-to-noise ratio (e.g., due to use of a reduced minimum size data set), the procedure is much more time-tolerable to an MRI patient.

In brief summary, the desired relaxometry background field strength is applied and maintained for a known duration Δt. It may be for a relatively long (e.g., on the order of the T1 parameter value being measured or longer). During this time no RF signals are being transmitted or received. However, in an immediately following time period—when the background field is at its usual nominal and fixed value $B_o$—the effective T1 value for the NMR nuclei is measured. If the measurement time period is substantially shorter than the relaxometry field period, the T1 value associated with the desired relaxometry field strength value will predominate and produce the desired measurements providing T1 versus magnetic field strength data for in vivo tissue containing the NMR nuclei.

If the measurement time period is not substantially shorter than the relaxometry field period, then a penalty is attached to this multi-field strength approach. Namely, within a single relaxometry data acquisition cycle, the calculation of T1 is somewhat more complicated—since NMR relaxation actually occurs at two different field strengths during the MRI relaxometry sequence.

Furthermore, by using an appropriate NMR/MRI sequence such as explained below in one of the exemplary embodiments, the computation can be simplified. For example, in one exemplary embodiment of this invention, a 90° RF NMR nutation pulse is introduced just prior to switching "on" the switched background field. Thereafter, immediately after switching the supplemental background field "off" (and therefore returning to the same constant background field strength $B_o$), a 90° followed by 180° RF NMR nutation pulse sequence is performed so as to generate a spin echo RF NMR response within a relatively short time (i.e., a short TE). In such case, the T1 relaxation at the switched "on" composite background field strength dominates the observed change in NMR signal strength. Two such NMR measurement sequences using different time intervals between the 90° RF nutation pulses of appropriate lengths (e.g., as related by integer multiples) permit the T1 relaxation parameter to be determined in a relatively straightforward manner (e.g., in accordance with the teaching of Ortendahl et al, "Analytical Tools for Magnetic Resonance Imaging", *Radiology Vol.* 153, No. 2, November 1984, pp 479–488) for one field strength. Thereafter, if other imaging parameters are maintained constant, T1 can be determined in only a single further measurement cycle for each different field strength. That is, N relaxometry data points can be determined in only N+1 measurement cycles.

It is believed that this novel switched-field approach to NMR relaxometry provides a more practical way to achieve in vivo relaxometry in magnetic resonance imaging than heretofore. (For example, see an earlier in vivo MRI relaxation technique as described in Crooks et al, "Magnetic Resonance Imaging: Effects of Magnetic Field Strength," *Radiology*, Vol 151, No. 1, April 1984, pp 127–133.)

Thus, compared to prior relaxometry approaches (even the non-imaging approaches), we have achieved considerable advantage in at least each of the following ways:

1. Use of an initial 90° NMR RF nutation pulse (in one of the exemplary embodiments) to more quickly initialize nuclei magnetization state;
2. acquisition of N relaxometry data points (T1,B) using only N+1 measurement cycles (in both the first two exemplary embodiments); and
3. MRI of relaxometry data measured in time efficient procedures (in all exemplary embodiments)—e.g., thus permitting interleaved imaging measurements so as to preserve registration of patient anatomy vis-a-vis the acquired relaxometry data for each imaged voxel.

These as well as other objects and advantages of this invention will be more completely understood and appreciated by careful study of the following detailed description of the presently preferred exemplary embodiments of this invention taken in conjunction with the accompanying drawings, of which:

Figure 1:
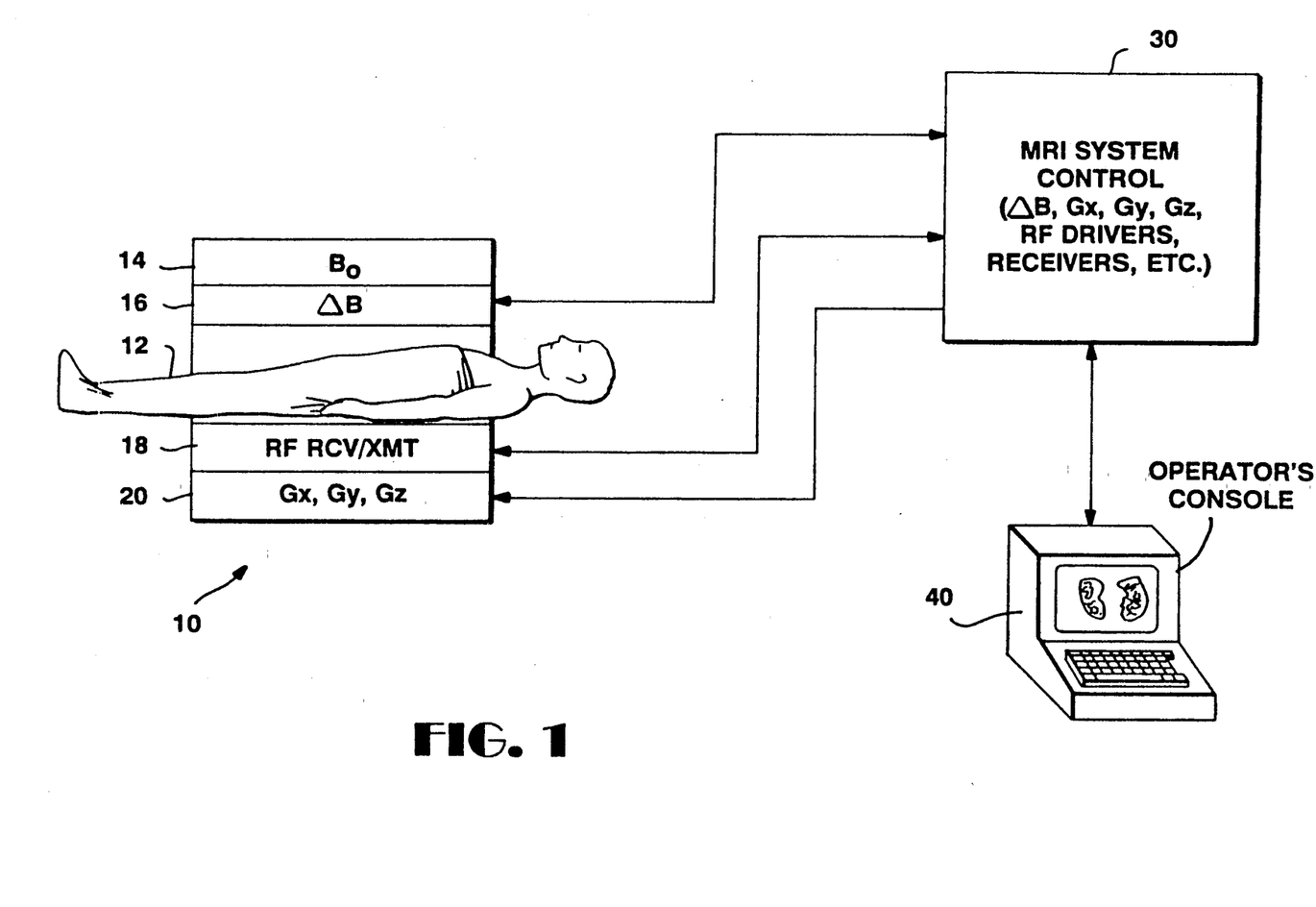
FIG. 1 is a simplified general block diagram of a switched-field MRI system suitable for practicing the exemplary embodiment of this invention.

FIG. 1 is a simplified schematic depiction of a typical MRI system that has been adapted to practice this invention. For example, it includes the usual gantry system 10 in which an image volume is adapted to receive a living human subject 12. A suitable generator 14 of a substantially homogeneous background magnetic field $B_o$ is provided. This may be a solenoidal cryogenic electromagnetic (with the main background magnetic field oriented horizontally), a suitable permanent magnet structure (typically with the field oriented vertically) or the like.

An additional switched "background" magnetic field $\Delta B$ generator 16 is also provided as described in our above-referenced related co-pending parent application Ser. No. 07/545,068 so as to selectively alter the background magnetic field strength at selected times during MRI data gathering cycles. The usual RF receiving and/or transmitting coils 18 are also provided and closely RF coupled to the image volume. The usual gradient coil structures $G_x$, $G_y$, $G_z$, 20 are also provided.

The controllable portions of the gantry system 10 are controlled by a suitable MRI system control 30 having a system of computers, input/output drivers, RF receiver/transmitter circuits, etc., as will be known to those skilled in this art. Typically, the interface for operator control may be an operator console 40 having the usual keyboard and screen for inputting control commands for viewing MRI data, parameters, images, etc. As will be appreciated, other peripheral devices are typically provided for recording MRI data, images, etc.

Figure 2:
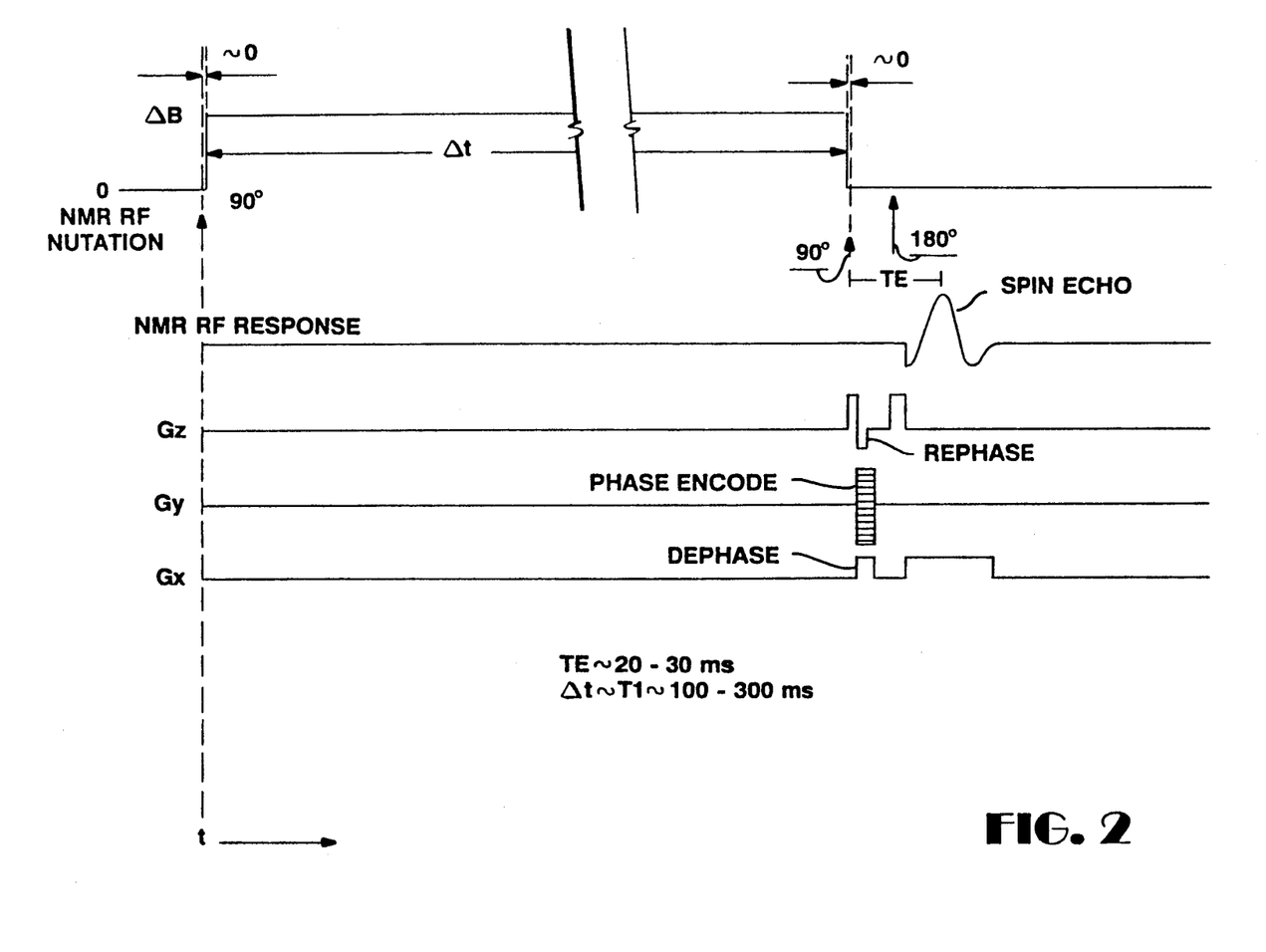
FIG. 2 is a timing diagram showing an exemplary sequence of RF nutation pulses switched magnetic fields, magnetic gradients, etc., for an exemplary embodiment of this invention.

The MRI system of FIG. 1 is, in one exemplary embodiment, programmed so as to effect the exemplary MRI relaxometry cycles depicted at FIG. 2. Here, immediately after a 90° NMR RF nutation pulse, the switched field is turned "on" to effect a composite background magnetic field strength of a selected magnitude. This switched field strength is maintained for a time on the order of the value of the NMR T1 parameter to be measured (e.g., 100-300 milliseconds). In other words, the NMR nuclei are preferably permitted to approach saturation magnetization in accordance with the switched field strength magnitude.

Immediately thereafter, 90° and 180° NMR RF nutation pulses are imposed in relatively quick succession so as to elicit an NMR RF spin echo signal response still having a characteristic magnitude related to the earlier switched background magnetic field strength. The time to echo or TE parameter is preferably made relatively short compared to the expected T2 value. For example, TE is, in the exemplary embodiment, maintained less than about 20 to 30 milliseconds.

The $G_z$, $G_y$ and $G_x$ gradient field pulses depicted in FIG. 2 are typical of those used for two-dimensional Fourier Transform (2 DFT) MRI. In this manner, spin echo response magnitudes for each voxel of a two-dimensional image "slice" volume through the patient 12 may be obtained. As should be apparent, three-dimensional Fourier Transform MRI, projection reconstruction MRI or other types of MRI measurement cycles could also be used. Furthermore, in vivo relaxometry measurements could be made on selected "slices" as a whole or other portions within the image volume or engross for the entire image volume without any imaging per se. Relaxometry can be combined with spectroscopy and imaging for additional information.

The elicited spin echo (SE) RF responses are proportional (assuming all other imaging parameters to remain constant) to the following function of the time duration $\Delta t$ and the T1 parameter associated with the switched background magnetic field:

$$SE \propto 1-\exp(-\Delta t/T1) \quad \text{(Equation 1)}$$

At one particular field strength, if TE is kept constant, then two different measurements (at different TR values) are needed to solve for T1 since there are two unknowns. One unknown is T1, the other is a multiplicative combination of equilibrium magnetization density, receiver efficiency and gain, and an exponential factor of T2 decay. If the field is now switched (e.g., upwards by 50%), the "other" factor (involving equilibrium magnetization density, receiver efficiency, gain and T2, etc) goes linearly with the field strength. Thus, after the first data point is measured using as few as two measurement cycles, there remains effectively only one unknown for each different field strength to be probed. Accordingly, by measuring SE signal using two different $\Delta t$ values at one field strength, then measuring one point with a $\Delta t$ on the order of T1 at each new field strength (TE being held constant) one can calculate the desired T1 value at each new probed magnetic field strength using but a single further measurement cycle.

Since there is no read-out actually taken during the time the switched field is present, there is less requirement for the switched field to be absolutely constant, homogeneous, etc. Of course to the extent the switched field can be made constant and homogeneous, that would be desirable.

Figure 3:
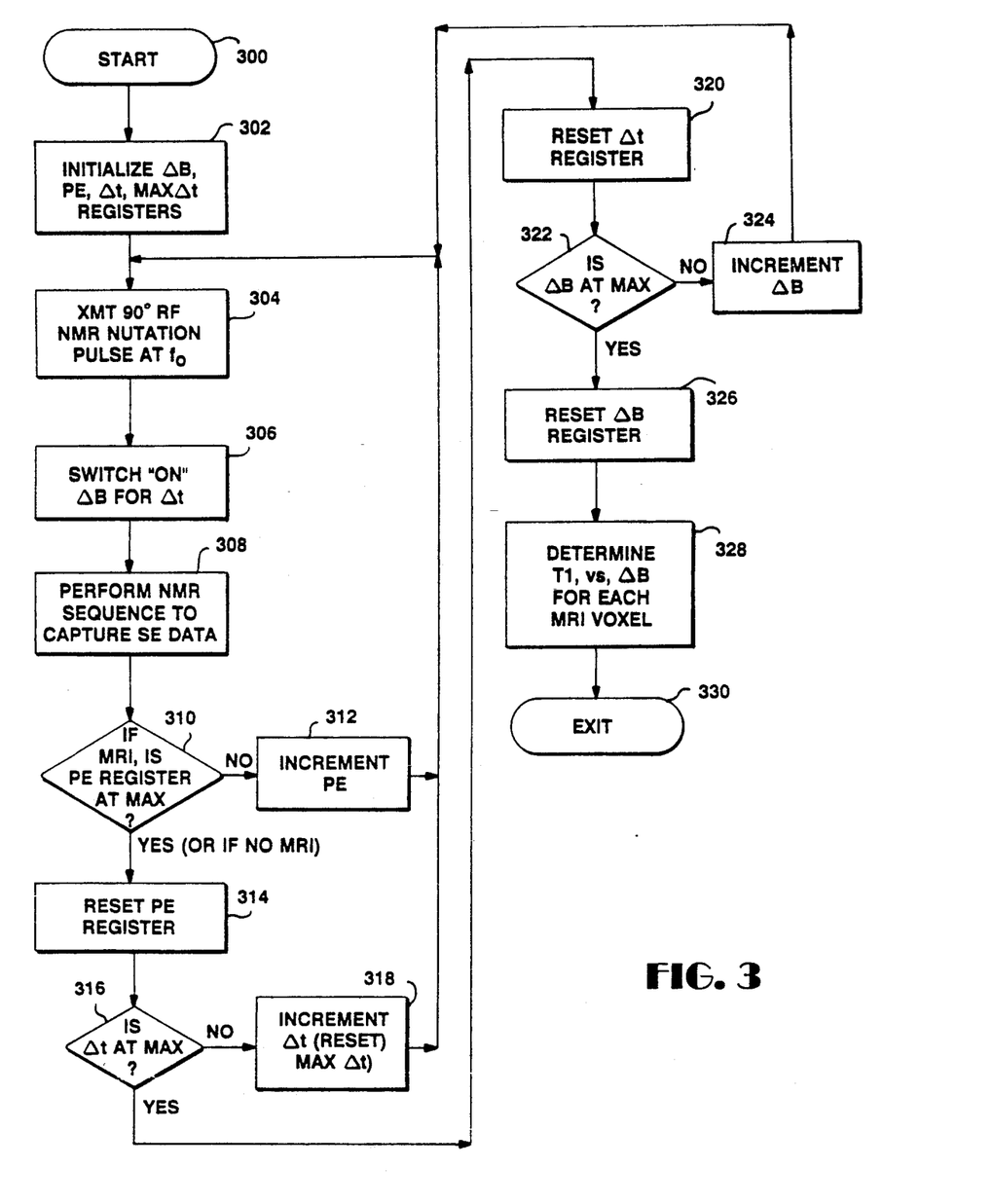
FIG. 3 is a flowchart of an exemplary program segment that may be incorporated into the programmed MRI system control of FIG. 1 so as to practice the exemplary embodiment of this invention.

To implement the saturation recovery NMR relaxometry sequence depicted in FIG. 2, the NMR system control 30 of FIG. 1 can be programmed as generally depicted in the flowchart of FIG. 3. Here, upon entry at 300 to this program segment, initialization is effected at 302 (e.g., so as to initialize the values stored in the switched field magnitude register $\Delta B$, the phase encoding register PE and the switched field duration register $\Delta t$).

Thereafter, a 90° RF NMR nutation pulse is transmitted at the usual Larmor frequency associated with the nominal background $B_o$ at 304. Immediately thereafter, a switched field is switched on for the $\Delta t$ duration at 306. Immediately, thereafter, a 90°-180° NMR sequence is performed at 308 so as to capture suitable spin echo data for the existing phase encoded $G_y$ value. A test is then made at 310 (if magnetic resonance imaging is to be employed) so as to see if the phase encoding register has yet reached the maximum desired phase encoded value. If not, the phase encoding register PE is incremented at 312 and the cycle is repeated by returning control to block 304.

Eventually, all of the desired phase encoded spin echo responses will have been captured (e.g., 256 of them if MRI is being performed or zero if no imaging is to be performed) and the phase encoding register PE will be reset at 314 in readiness for a subsequent MRI cycle. A test is then made at 316 to see if the duration register $\Delta t$ is yet at its maximum value. If not, that register is incremented at 318 (e.g., by an integer multiple) and control is again returned to block 304 for another MRI cycle at the next $\Delta t$ increment. As will be understood, in the exemplary embodiment, the maximum $\Delta t$ value will be reset at 318 so that after the first relaxometry data point has been captured only one $\Delta t$ value is used for each new $\Delta B$ measurement field.

After the desired number of MRI cycles for different $\Delta t$ increments (e.g., two on the first $\Delta B$ value, one thereafter), the $\Delta t$ register is reset at block 320 in readiness for a future data gathering cycle and a test is made at 322 to see if the switched field magnitude register $\Delta B$ is yet at its desired maximum value. If not, the switched field is incremented at 324 and control is again returned back to block 304 for yet another MRI data gathering cycle. Finally, after data is gathered for all of the desired ΔB increments, the ΔB register is reset at 326.

At that time (or subsequently if desired) the desired relaxometry measurements of T1 versus ΔB may be determined for each MRI voxel (e.g., the first using two Δt values in accordance with the teachings of the related Ortendahl et al teachings and subsequent points using only single Δt values per point as noted above). Ultimately, the program segment of FIG. 3 is then exited at 330 and control is returned to other conventional programming within the MRI system control 30.

As should now be apparent, individual relaxometry measurement cycles (as depicted in FIG. 2) can also be interleaved between conventional MRI data acquisition cycles to better preserve data/image registration of the patient.

Figure 4:
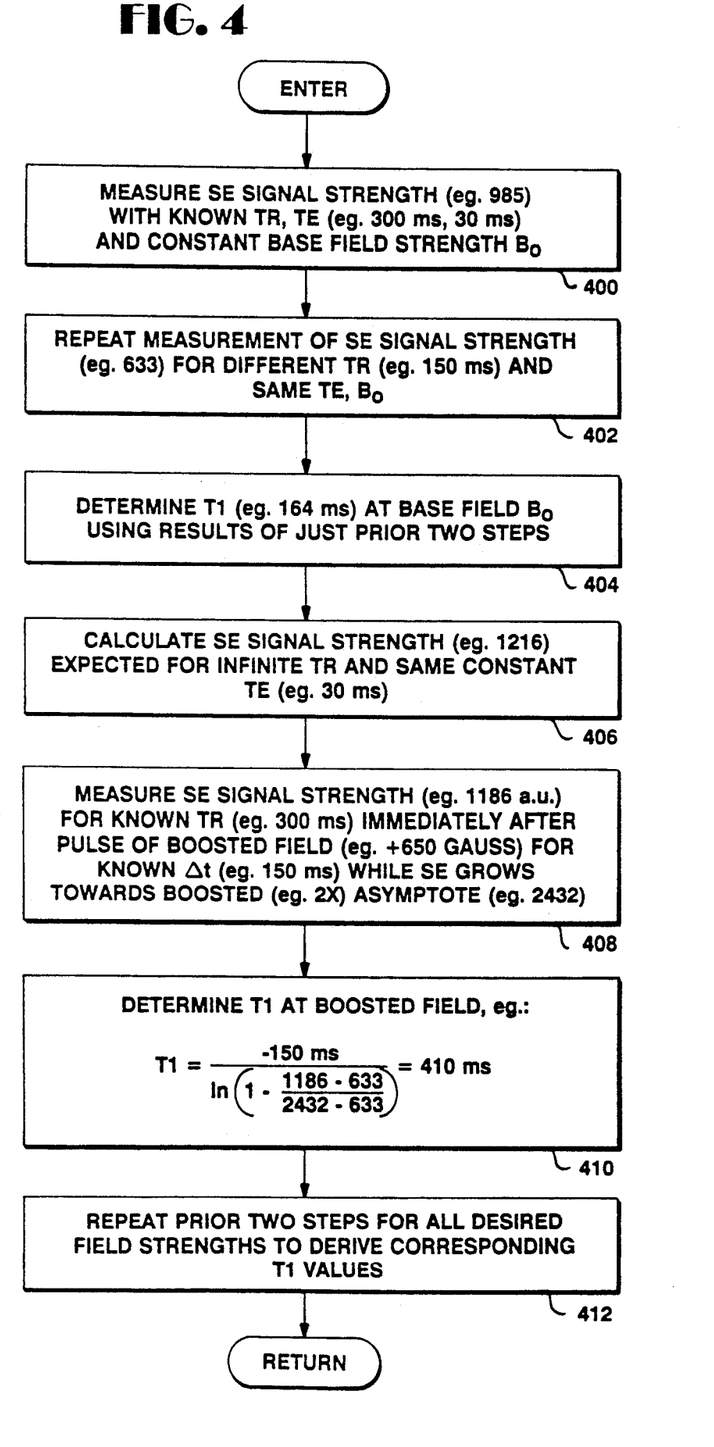
FIG. 4 is a flowchart of another exemplary program segment that may be incorporated into the programmed MRI system control of FIG. 1 so as to practice the exemplary embodiment of this invention.

Another exemplary embodiment (as depicted in FIG. 4) avoids the use of a 90° RF saturation pulse prior to each change in the background field $B_o$. Here, use is made of the well-known relationship between NMR nuclei magnetization (and the related NMR spin echo (SE) signal magnitude) changes with respect to the well-known NMR parameters TE, TR, T1 and T2:

$$SE \propto [\exp(-TE/T2)][1+\exp(-TR/T1)-2\exp\{-(TR-TE/2)/T1\}] \quad \text{(Equation 2)}$$

First, by keeping TE constant, the TE and T2 dependence can be reduced to just another constant factor of proportionality:

$$SE \propto 1+\exp(-TR/T1)-2\exp[-(TR-TE/2)/T1] \quad \text{(Equation 3)}$$

Then, the two NMR spin echo experiments (e.g., SE=985 and 633 signal strength units, respectively) depicted at 400, 402 at the constant base background field $B_0$ (e.g., 650 Gauss) and constant TE (e.g., 30 ms) but different TR values (e.g., 300 ms and 150 ms) permits determinations of T1 (e.g., 164 ms) at step 404 using conventional exponential curve fitting techniques (e.g., empirical trial and error using different known exponential curves).

Once T1 at the base field $B_o$ is thus derived, the asymptote (e.g., 1216 signal strength units) is similarly ascertainable at 406 for an infinite TR spin echo experiment using the same other NMR parameters.

Thereafter, as depicted at steps 408 and 410, for each changed background field strength ΔB pulse of Δt duration, one immediately following NMR spin echo experiment (using the same constant TE at the same base field $B_o$) suffices to determine T1 at the changed background field value:

$$T1 = -\Delta t/\ln[1-(SE_m-SE_x)/(M \cdot SE_a-SE_x)] \quad \text{(Equation 4)}$$

where

T1 = the T1 NMR parameter value at the changed background field strength
Δt = the time duration of the changed field pulse
$SE_m$ = the spin echo signal magnitude measured immediately following the changed field pulse
$SE_x$ = the spin echo signal magnitude which would result at hypothetical TR interval which would result if Δt is reduced to zero
M = the ratio of the changed magnetic field to the background magnetic field
$SE_a$ = the asymptotic spin echo signal magnitude for the background magnetic field strength In the example depicted at steps 408 and 410, the measured spin echo magnitude was 1186 of the same arbitrary signal strength units used in the other FIG. 4 measurements. Thus, T1 at the boosted 1300 Gauss field strength is determined to be 410 ms. Repetition of steps 408 and 410 for other field strengths will yield the respectively corresponding T1 values as depicted at 412 in FIG. 4.

To summarize, first, with a TR=300 ms, TE=30 ms, constant field sequence one measures a signal of 985 (arbitrary units). Repeating this with TR=150 ms, the same echo time TE gives a measured signal of 633 of the same arbitrary units. One can now solve the T1 (e.g., 164 ms) at the base field strength and the signal (e.g., 1216) we would expect to measure in an infinite TR spin echo experiment at the same constant TE. Now, with one more measurement using a TR=300 ms, using a field boost of 650 Gauss for 150 ms produces a measured signal of 1186. We can use this one piece of data to get the new T1. After 150 ms at the lower field, if the NMR spin echo experiment were repeated at that TR (i.e., TR=150 ms), then the SE signal and/or nuclei magnetization would be 633 units. However, in reality in this experiment, in the remaining 150 ms, the magnetization grows towards the new equilibrium asymptote value of 2432 (this is 2 times the old asymptote; the factor of two comes from the 2 x boost in the field) and actually is measured as 1186. This is enough to give T1 at the higher field $$T1 = \frac{-150 \text{ ms}}{\ln\left(1 - \frac{1186 - 633}{2432 - 633}\right)} = 410 \text{ ms} \quad \text{[Equation 5]}$$

As will be apparent to those in the art, other cases such as for different times for high and low field strengths and multi-slice sequences can be similarly derived. It will also be apparent that the process of FIG. 4 can be viewed as a flowchart description of a computer program subroutine module.

Figure 5:
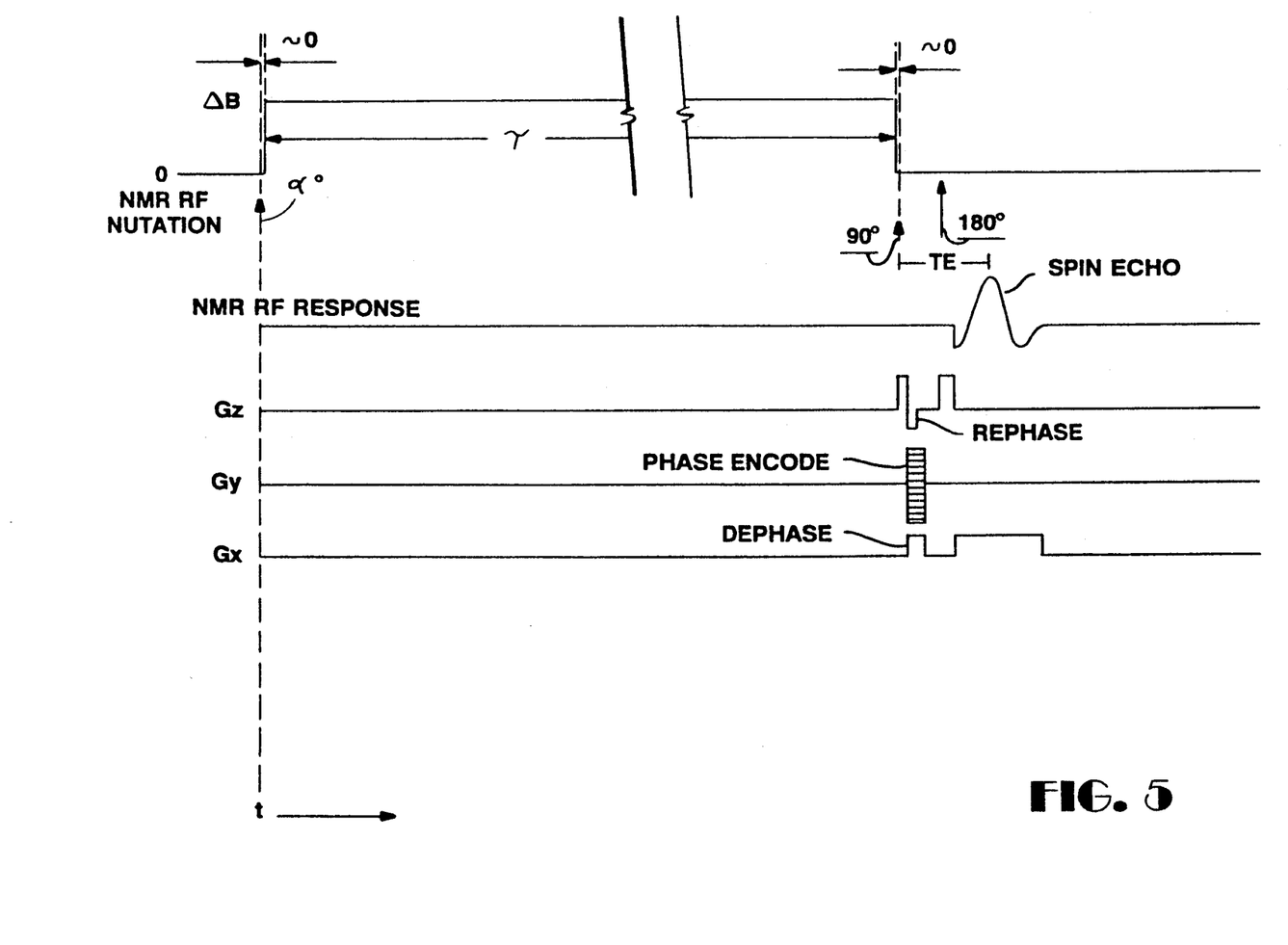
FIG. 5 is a timing diagram showing an exemplary sequence of RF nutation pulses, switched magnetic fields, magnetic gradients, etc., for another exemplary embodiment of this invention.

In the earlier described embodiments, Δt is used as one of the controlled relaxometry variables. However, we have now discovered another class of embodiments where Δt can remain fixed (thus facilitating use of constant TR intervals and/or further conserving data acquisition time) by using a variable initial flip angle α as the controlled relaxometry variable. One exemplary basic process is depicted in FIG. 5 and may be considered as having three parts:

1. Flip the spin system through some initial nutation or "flip" angle α.
2. Turn on the field booster ΔB for some amount of time τ (which may be at a constant predetermined value through the relaxometry process).
3. Turn off the field booster ΔB and measure the magnetization with a conventional 2D or 3D imaging sequence.

A first variable flip angle α embodiment uses a TR interval much greater than T1 (at the base field $B_o$). As before, T1 is of roughly the same order of magnitude as the duration τ of the switched boost field. Here, if a very long TR is used, then the nuclei magnetization just prior to each α nutation pulse would be essentially equal to its equilibrium value. If so, then MRI data acquisitions could be performed for each of plural $\alpha$ values, boost, image sequences to extract T1 information.

Although relatively straightforward, this full equilibrium approach is not time efficient. Shorter TR values are needed for practical applications. However, this means that $m_z$ just prior to the $\alpha$ nutation pulse is not at full equilibrium value $m_o$, but, rather, is smaller by a factor well known in the art: $M_z = m_o (1-\exp\text{-}TR/T1)$. Although the net magnetization just prior to imposition of the initial flip (i.e., nutation) pulse angle $\alpha$ will typically not be at full equilibrium, it will exhibit a corresponding characteristic steady state magnitude. By performing a regular MRI sequence without any $\alpha$ nutation pulse or $\Delta B$ boost field, one can obtain voxel values representative of such steady state magnetization. Then, by performing two more similar MRI sequences but using respectively different nutation angles $\alpha_1$ and $\alpha_2$ (and a particular $\Delta B$ value), one can calculate T1 for each voxel at that $\Delta B$ value. In other words, to obtain N relaxometry data points $(T1_1, B_1), (T1_2, B_2) \ldots (T1_N, B_N)$ for each voxel, one performs $2N+1$ MRI sequences (using the more detailed processes now to be described).

Assume (for now) that at the end of the imaging sequence and prior to the next $\alpha$ nutation pulse, the magnetization has fully relaxed. The T1 value at the boosted field strength, T1(f), will be different from the T1 value at the base field strength, $T1(f_o)$. However, the equilibrium magnetization is known to be proportional to field strength and may be denoted as $m_o$ (i.e., at the base magnetic field strength Bo. The ratio of total field strength at boost time to base magnetic field may be denoted as f. The equilibrium magnetization is therefore $fm_o$.

The z component of the magnetization prior to the initial $\alpha$ flip pulse is $m_o$. Immediately afterwards it is $m_o\cos\alpha$. Relaxation in the boost field produces magnetization after a time $\tau$.

$$m_z = fm_0(1-\exp(-\tau/T1(f))) + M_0 \cos(\alpha)\exp(-\tau/T1(f))$$ [Equation 6]

Images are then acquired at a collection of flip angles $\alpha_1, \alpha_2 \ldots$ The intensities of the images in a particular voxel will depend on the flip angle. This set of images can be analyzed to find: (1) a component of the image intensity proportional to the cosine of the initial flip angle $\alpha$ and (2) a component independent of the flip angle $\alpha$. If these two numbers (call them A and B) and the field ratio f are known, one can compute T1(f) from the formula $$T1(f) = \frac{\tau}{\ln(1 + A/fB)}$$ [Equation 7]

The simplest thing to do is a two point fit. If images are acquired with $\alpha_1 = 0°$ and $\alpha_2 = 180°$, one can compute the quantity A from the average of the two images and B from the difference of the two images. Of course, other combinations of two flip angles can be used to give similar results. A more reliable technique may use more than two flip angles. In this case, a nonlinear fit to the data should be made using any of the known methods for calculating best fits to data.

Other types of variable flip angle embodiments are also envisioned. For example, the analysis is more complicated if effects are considered from either: (1) finite delays between turning off the boost field and starting the image acquisition, or (2) incomplete relaxation at the end of the imaging pulse sequence are included. The first effect may be minimized and may be considered trivial in any event. However, the second effect (i.e., finite TR) is of more concern. Here, for example, TR may be only slightly longer than T1. This changes the relevant equation to:

$$m_2 = fm_0(1-\exp(-\tau/T1(f))) + m_0 \cos(\alpha)(1-\exp(-TR/T1(f_0))) \exp(-\tau/T1(f))$$ [Equation 8]

This effect can be compensated if the T1 of the tissue is known and the term B (of Equation 7) is divided by a factor of $1 - \exp(TR/T1(f_o))$.

Another way to effect compensation is to repeat the imaging sequence, but leave out the $\alpha$ pulse and the boost $\alpha B$. If the entire imaging experiment is repeated, the signal intensity is proportional to:

$$m_0(1-\exp(-TR/T1(f_0)))$$ [Equation 9]

Thus, one needs to acquire boost images with $\alpha = 0$ and $\alpha = 180$. Subtracting these provides something proportional to:

$$2m_0(1-\exp(-TR/T1(f_0))) \exp(-\tau/T1(f))$$ [Equation 10]

Next, one may acquire an image with no $\alpha$ pulse and no boost $\Delta B$, this gives all image proportional to:

$$m_0(1-\exp(-TR/T1(f_0)))$$ [Equation 11]

Taking the ratio provides:

$$2\exp(-\tau/T1(f))$$ Equation 12]

If the ratio is divided by two, its logarithm provides the final result. This is thus a second embodiment. It requires three images in the minimal acquisition instead of just two. However, TR can be short so that much less time is required. Also, the exact value of the field is not needed to extract the T1 value, so this is better in cases where the boost field is inhomogeneous.

Figure 6:
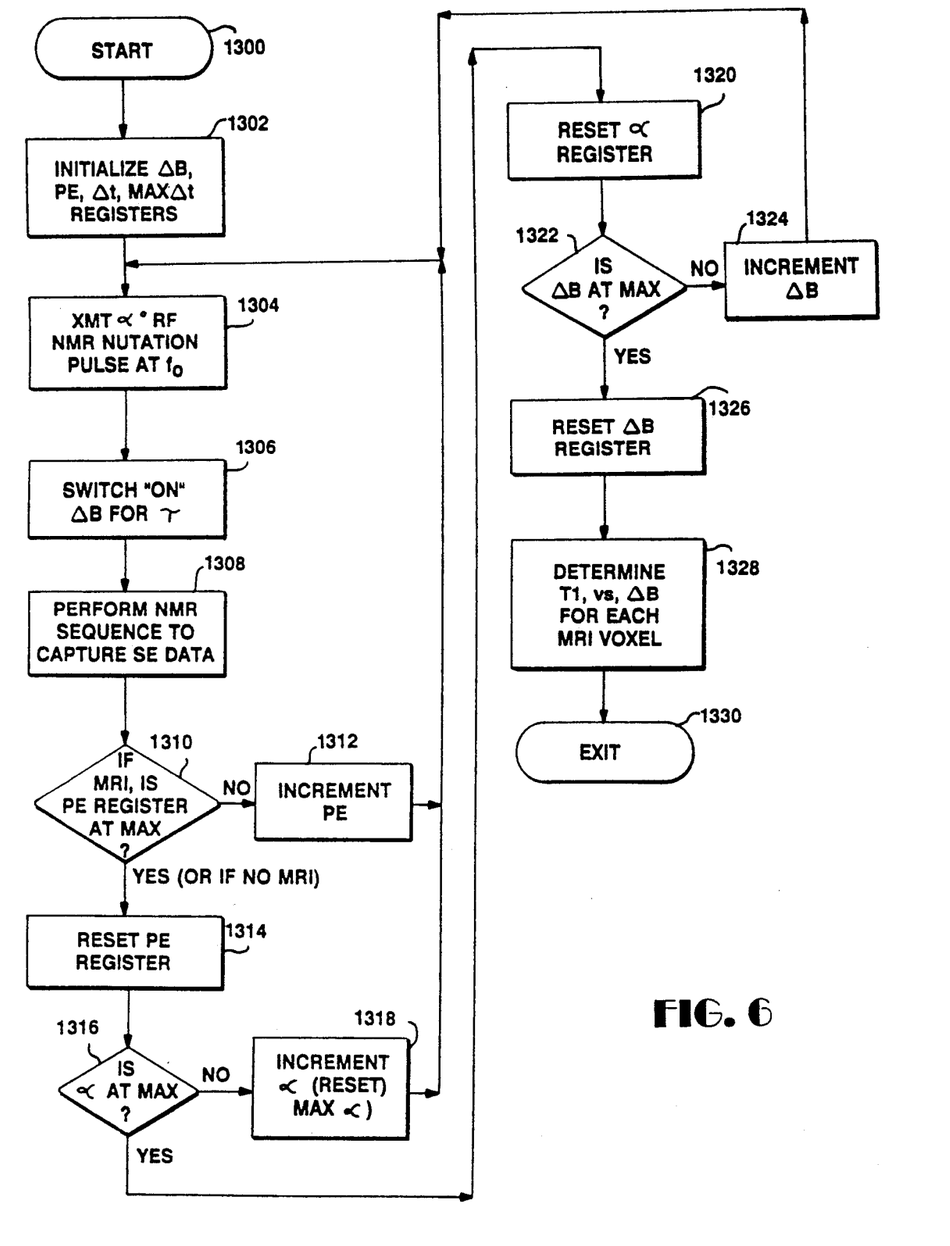
FIG. 6 is a flowchart of an exemplary program segment that may be incorporated into the programmed MRI system control of FIG. 1 to practice the exemplary embodiment of FIG. 5.

The basic process for the first variable flip angle embodiment is illustrated in the flowchart of FIG. 6 where the boosted field $\Delta B$ is turned on for a constant $\tau$ while the initial NMR nutation pulse $\alpha$ is varied as a controlled relaxometry variable parameter. In effect. FIG. 6 is similar to FIG. 3 except that the variable $\Delta t$ has become a fixed parameter $\tau$ while the fixed 90° initial flip angle has become a controlled relaxometry variable $\alpha$. The comparable boxes in FIG. 6 have similar reference numbers to those in FIG. 3 when incremented by 1000. As will be appreciated, if the $\Delta B$ and $\alpha$ registers are initially set to zero, then one effectively obtains the desired initial "steady state" magnetization values on the first loop through the program. Thereafter, $\alpha_1$ and $\alpha_2$ values may be used for each of plural. $\Delta B$ values to obtain a full set of T1 versus B relaxometry data for each voxel.

While only a few exemplary embodiments have been described in detail, those skilled in the art will realize that many variations and modifications may be made in such exemplary embodiments while yet retaining many of the novel features and advantages of this invention. Accordingly, all such variations and modifications are intended to be included within the scope of the appended claims.

What is claimed is:

1. A method for obtaining a NMR relaxometry image of in vivo patient tissue using a MRI system having a nominally fixed background magnetic field, said method comprising the steps of:
 (a) subjecting said patient tissue to an RF NMR nutation pulse of $\alpha$ degrees;
 (b) subjecting said patient tissue to a supplemental magnetic field strength $\Delta B$ for a time interval $\tau$ during which the sample exhibits a respectively corresponding NMR relaxation parameter value;
 (c) in a further time interval, subsequently performing a MRI data acquisition cycle using said fixed background magnetic field; and
 (d) repeating steps (a) through (c) for a plurality of different values of initial flip angle $\alpha$ to generate a NMR relaxometry image of said patient tissue.

2. A method as in claim 1 wherein said time interval $\tau$ is a fixed value and steps (a) through (c) are also repeated for different magnetic field strengths $\Delta B$ to generate T1 versus $\Delta B$ relaxometry image data for said patient tissue.

3. A method as in claim 1 wherein further MRI measurements are interleaved between one or more repetitions of steps (a) through (c) to help preserve registration between an MR image and an NMR relaxometry image of the patient tissue.

4. A method as in claim 1 wherein the patient tissue has an expected T1 NMR relaxation parameter and wherein said MRI data acquisition uses a repetitive time TR which is much greater than the T1 parameter of the patient tissue.

5. A method as in claim 1 wherein the patient tissue has an expected T1 NMR relaxation parameter and wherein said MRI data aquisition uses a repetition time TR which is on the same order as the T1 parameter of the patient tissue.

6. A method as in claim 1 wherein the patient tissue has an expected T1 NMR relaxation parameter and wherein $\tau$ is of the same order as T1 of the patient tissue.

7. A method as in claim 4 wherein $\tau$ is of the same order as T1 of the patient tissue.

8. A method as in claim 5 wherein $\tau$ is of the same order as T1 of the patient tissue.

9. A method of magnetic resonance imaging which provides an in vivo T1 NMR relaxometry image of patient tissue, said method comprising the steps of:
 (a) performing a MRI data acquisition cycle to obtain a steady state magnetization image;
 (b) applying an initial NMR RF nutation pulse $\alpha$ to said patient tissue using a fixed background magnetic field;
 (c) applying a supplemental magnetic field strength $\Delta B$ said patient tissue for a time interval $\tau$ which is on the order of the expected T1 NMR value of said patient tissue;
 (d) thereafter performing a MRI data acquisition cycle again using said fixed background magnetic field and obtaining NMR data for plural voxels representative of the T1 parameter values for patient tissues within each voxel corresponding to said magnetic field strength $\Delta B$;
 (e) repeating steps (b)–(d) for plural different initial NMR RF nutation pulse values $\alpha$ thus acquiring T1 NMR relaxometry image data for said patient tissue.

10. A method for performing NMR relaxometry, said method comprising:
 (a) subjecting a sample to a predetermined RF NMR nutation pulse $\alpha$ at a predetermined and fixed background magnetic field strength;
 (b) thereafter subjecting said sample to a different magnetic field strength—for a substantial time interval $\tau$ during which the sample exhibits a respectively corresponding NMR relaxation parameter value;
 (c) in a further time interval, subsequently measuring said corresponding NMR relaxation parameter value using said predetermined and fixed background magnetic field strength; and
 (d) repeating steps (a), (b) and (c) for a plurality of different NMR nutation pulse values $\alpha$ thereby to generate NMR relaxometry data for said sample.

11. A method as in claim 10 wherein step (b) is performed without substantial delay after step (a) and wherein step (c) is performed without substantial delay after step (b).

12. A method as in claim 10 wherein the sample has an expected T1 NMR relaxation parameter and wherein the magnetic field strength $\Delta B$ is substantially constant through step (b) but which is incremented to different values for at least some of said repeating step (d) to generate a T1 versus B relaxometry image for said sample.

13. A method as in claim 10 wherein steps (a)–(c) comprise a magnetic resonance imaging sequence providing NMR relaxometry data for each of plural volume elements within said sample.

14. Apparatus for obtaining a NMR relaxometry image of in vivo patient tissue using a MRI system having a nominally fixed background magnetic field, said apparatus comprising:
 (a) means for subjecting said patient tissue to an RF NMR nutation pulse of $\alpha$ degrees;
 (b) means for subjecting said patient tissue to a supplemental magnetic field strength $\Delta B$ for a time interval $\tau$ during which the sample exhibits a respectively corresponding NMR relaxation parameter value;
 (c) means for subsequently performing a MRI data acquisition cycle in a further time interval using said fixed background magnetic field; and
 (d) means for causing means (a) through (c) to repeat their operation for a plurality of different values of initial flip angles $\alpha$ to generate a NMR relaxometry image of said patient tissue.

15. Apparatus as in claim 14 wherein said means (b) includes means for causing time interval $\tau$ to be a fixed value and for causing the field strength $\Delta B$ value to be incrementally changed for at least some repeat operations of means (a) through (c).

16. Apparatus as in claim 14 comprising means for interleaving MRI measurements between one or more repetitive operations of means (a) through (c) to help reserve registration between an MR image and an NMR relaxometry image of the patient tissue.

17. Apparatus for magnetic resonance imaging which provides an in vivo T1 NMR relaxometry image of patient tissue, said apparatus comprising:
 (a) means for applying an initial NMR RF nutation pulse $\alpha$ to said patient tissue using a fixed background magnetic field;
 (b) means for applying a supplemental magnetic field strength $\Delta B$ said patient tissue for a time interval $\tau$ which is on the order of the expected T1 NMR value of said patient tissue;

(c) means for performing an MRI data acquisition cycle again using said fixed background magnetic field and obtaining NMR data for plural voxels representative of the T1 parameter values for patient tissues within each voxel at said magnetic field strength ΔB;

(d) means for causing repetitive operation of means (a)-(c) for plural different initial RF nutation pulse values α thus acquiring T1 NMR relaxometry image data for said patient tissue.

18. Apparatus for performing NMR relaxometry, said apparatus comprising:

(a) means for subjecting a sample to a predetermined RF NMR nutation pulse α at a predetermined and fixed background magnetic field strength;

(b) means for thereafter subjecting said sample to a different magnetic field strength for a first time interval during which the sample exhibits a respectively corresponding NMR relaxation parameter value;

(c) means for subsequently measuring said corresponding NMR relaxation parameter value using said predetermined and fixed background magnetic field strength after said time interval and in a further second time interval; and (d) means for repeatedly operating means (a)-(c) for a plurality of different NMR nutation pulse values α thereby to generate NMR relaxometry data for said sample.

19. Apparatus as in claim 18 wherein means (b) operates without substantial delay after means (a) and means (c) operate without substantial delay after means (b).

20. Apparatus as in claim 18 wherein means (b) includes means for maintaining the different magnetic field strength substantially constant during said first time interval.

21. Apparatus as in claim 18 wherein means (c) comprises means for performing a magnetic resonance imaging sequence providing NMR relaxometry data for each of plural volume elements within said sample.

* * * * *